United States Patent
Tsai et al.

(10) Patent No.: US 8,751,976 B2
(45) Date of Patent: Jun. 10, 2014

(54) PATTERN RECOGNITION FOR INTEGRATED CIRCUIT DESIGN

(76) Inventors: Cheng-Lung Tsai, Hsin-Chu (TW);
Jui-Hsuan Feng, Lotung (TW);
Sheng-Wen Lin, Kaohsiung (TW);
Wen-Li Cheng, Taipei (TW);
Wen-Chun Huang, Tainan (TW);
Ru-Gun Liu, Hsinchu County (TW)

( * ) Notice: Subject to any disclaimer, the term of this patent is extended or adjusted under 35 U.S.C. 154(b) by 45 days.

(21) Appl. No.: 13/534,300

(22) Filed: Jun. 27, 2012

(65) Prior Publication Data
US 2014/0007024 A1  Jan. 2, 2014

(51) Int. Cl.
*G06F 17/50* (2006.01)

(52) U.S. Cl.
USPC ............ 716/53; 716/50; 716/51; 716/55; 716/100; 716/110

(58) Field of Classification Search
CPC ......... G03F 1/36; G03F 7/70; G03F 7/70441; G06F 17/50; G06F 17/5045; G06F 17/5068
USPC .................... 716/50–55, 100, 110
See application file for complete search history.

(56) References Cited

U.S. PATENT DOCUMENTS

| | | | | |
|---|---|---|---|---|
| 7,131,104 | B2* | 10/2006 | Gallatin et al. | 716/53 |
| 2002/0188924 | A1* | 12/2002 | Pierrat et al. | 716/19 |
| 2010/0037200 | A1* | 2/2010 | Ghan et al. | 716/21 |
| 2010/0185998 | A1* | 7/2010 | Wang | 716/19 |

OTHER PUBLICATIONS

Jui-Hsuan Feng, U.S. Appl. No. 13/482,737, filed May 29, 2012, for "Integrated Circuit Design Method With Dynamic Target Point", 24 pages of text, 17 pages of drawings.

* cited by examiner

*Primary Examiner* — Paul Dinh
(74) *Attorney, Agent, or Firm* — Haynes and Boone, LLP (57) ABSTRACT

The present disclosure provides one embodiment of an integrated circuit (IC) method. The method includes building a pattern bank including a pattern having an area of interest. The method further includes recognizing that the pattern of the pattern bank corresponds to a pattern of an IC design layout. The method further includes identifying an area of interest of the pattern of the IC design layout that corresponds to the area of interest of the pattern of the pattern bank. The method further includes performing pattern recognition dissection on the area of interest of the pattern of the IC design layout to dissect the area of interest of the pattern of the IC design layout into a plurality of segments. The method further includes after performing pattern recognition dissection, producing a modified IC design layout.

18 Claims, 4 Drawing Sheets

PATTERN RECOGNITION FOR INTEGRATED CIRCUIT DESIGN

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of designing ICs and, for these advances to be realized, similar developments in IC design methods are needed.

For example, as the semiconductor industry has progressed into nanometer technology process nodes in pursuit of higher device density, higher performance, and lower costs, challenges from both fabrication and design have resulted in the development of various IC design methods. However, existing IC design methods are complex, error prone, and in certain instances fail to adequately address specific IC design concerns. Accordingly, although existing IC design methods have been generally adequate for their intended purpose, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern IC design and manufacturing may utilize various methods during the design process. IC design methods such as rule based dissection and rule based retargeting may be utilized. Rule based dissection, for example, provides for identifying specific segments of a pattern and applying suitable dissection rules to thereby dissect the pattern into multiple segments to achieve a desired contour. As an example, in the present embodiment, rule based dissection utilizes pattern or feature characteristics such as critical dimensions (CD), space, polygon orientation, polygon drawn length, etc. . . . , to dissect polygons into small segments with specified segment types (e.g., run, outvert, invert, single end, and jog types).

Rule based retargeting, for example, provides for a rule based means of utilizing theses specific segment types of a pattern and applying suitable retargeting rules to thereby retarget the segments produced by the dissection to achieve a desired contour. As an example, in the present embodiment, rule based retargeting utilizes pattern or feature characteristics such as segment type, critical dimensions (CD), segment orientation, segment length, space and angle orientation combination to identify the specific group segments of the pattern for applying special/specific geometry retargeting treatment.

Rule based dissection and rule based retargeting, however, may be overly complex and error pronged when being applied to certain circumstances. For example, in certain circumstances, the rule based approach to dissection and retargeting may allow for cancelling of rules which may not be easily detected by a user. Further, verification of the rule based approach to dissection and retargeting may become time consuming as adding new rules may exponentially increase verification time. As an example, rule based dissection and rule based retargeting may not be adequate (e.g., too complex or error pronged) to adequately address specific instances of contour deformity in areas of interest (or hot-spots) of the formed features.

According to various aspects of the present disclosure, pattern recognition dissection and pattern recognition retargeting for IC design layout is disclosed. The disclosed embodiments of pattern recognition dissection and pattern recognition retargeting allow for searching for patterns including specific areas of interest (or hot-spots) within the IC design layout, applying suitable dissection rules to the areas of interest, and applying suitable retargeting rules to the segments of the areas of interest (or hot-spots). The disclosed embodiments reduce the time and effort required to write recipe functions/tables for the various rules. Also, the disclosed embodiments reduce the risk of rule cancellation or rule conflict issues. Further, the disclosed embodiments reduce the verification process time. Different embodiments may have different advantages, and no particular advantage is necessarily required of any embodiment. The various aspects of such a method are disclosed in more detail below.

Figure 1:
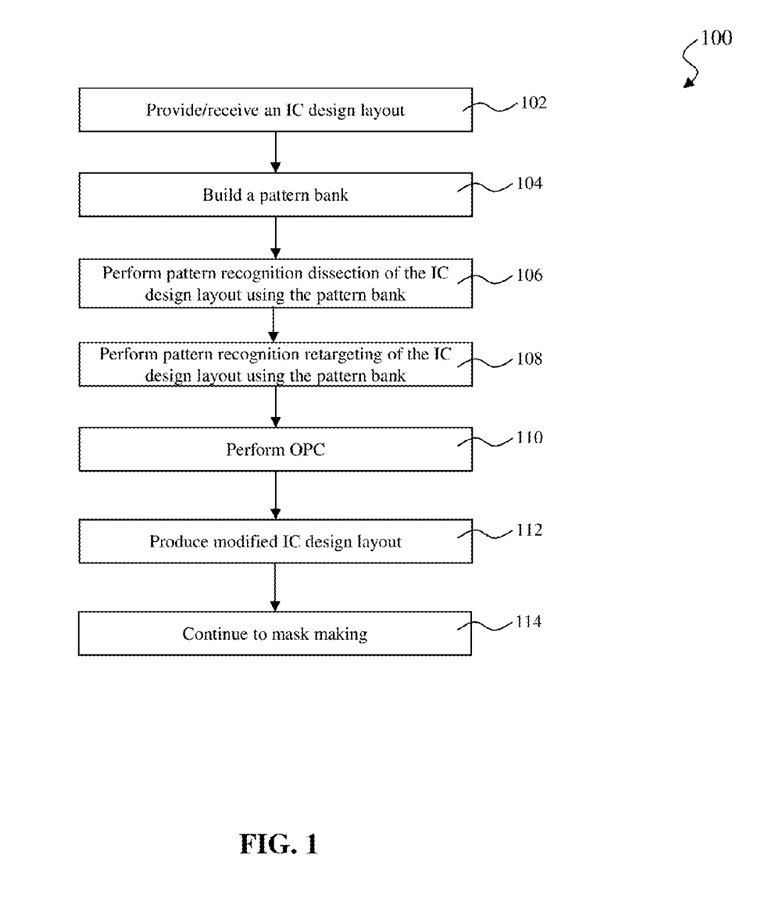
FIG. 1 is a flowchart of an embodiment of an integrated circuit (IC) method according to various aspects of the present disclosure.

FIG. 1 illustrates a flowchart of a method 100 for integrated circuit (IC) designing and mask making constructed according to various aspects of the present disclosure in one or more embodiments. The method 100 begins at step 102 by providing or receiving an IC design layout (or IC design pattern) from a designer. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The IC design layout may be presented in one or more data files having the information of the geometrical patterns. In one example, the IC design layout is expressed in a "gds" format. The designer, based on the specification of the product to be manufactured, implements a proper design procedure to carry out the IC design layout. The design procedure may include logic design, physical design, and/or place and route. As an example, a portion of the IC design layout includes various IC features (also referred to as patterns), such as active region, gate electrode, source and drain, metal lines or via of the interlayer interconnection, and openings for bonding pads, to be formed in a semiconductor substrate (such as a silicon wafer) and various material layers disposed over the semiconductor substrate. The IC design layout may include certain assist features, such as those features for imaging effect, processing enhancement, and/or mask identification information.

The method 100 proceeds to step 104 by building a pattern bank representative of patterns of the IC design layout. The pattern bank includes one or more patterns including one or more areas of interest (or hot-spots). The pattern bank, may be built based on empirical data obtained during the manufacturing of wafers, may be built based on empirical data obtained from manufactured wafers, may be built based on model data produced by a model of the IC design layout, or may be built based on a combination of empirical and model data.

Figure 2A:
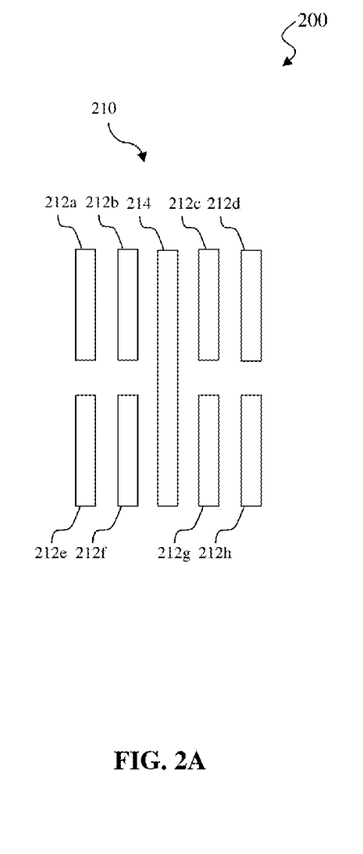
FIGS. 2-4 illustrate schematic views of a pattern of an IC design layout at various stages of the method of FIG. 1, according to various aspects of the present disclosure.

Referring to FIG. 2A, an exemplary design layout 200 includes a pattern 210 to be formed on a substrate. In one embodiment, the design layout 200 includes a pattern 210 having plurality of exemplary polygon features 212a-212h and 214 for illustration. As illustrated, the pattern 210 includes a relatively long polygon feature 214 having a plurality of relatively short polygon features 212a-212h adjacent to it.

Figure 2B:
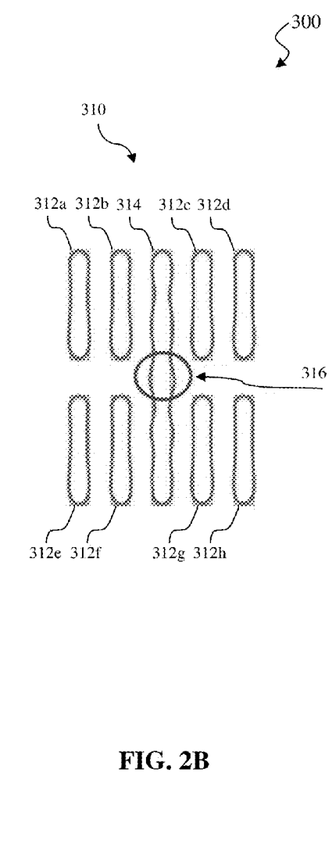

Referring to FIG. 2B, illustrated for discussion purposes, the pattern 210 from the design layout 200 is formed on a substrate 300 of a wafer. In one embodiment, the substrate 300 includes a formed pattern 310 having plurality of exemplary polygon features 312a-312h and 314. The formed pattern 310 features 312a-312h and 314 correspond to pattern 210 features 212a-212h and 2124 of the design layout 200. As illustrated, the pattern 310 includes a relatively long polygon feature 314 having a plurality of relatively short polygon features 312a-312h adjacent to it. The feature 314 includes an area of interest (or hot-spot) 316 in a center region. As illustrated, the area of interest 316 of feature 314 has deformities (e.g., waves) that have resulted from the manufacturing process.

A specific pattern including the area of interest 316 may be identified to be included in the pattern bank by analyzing current/historical empirical data obtained from the manufacturing process or by analyzing model data. Analyzing the current/historical empirical or model data may include identifying areas of interest (e.g., critical areas) of the pattern and determining if the current manufacturing is inducing deformities, irregularities, or other defects within the area of interest. The specific pattern including the area of interest 316 to be included in the pattern bank may include all or only select features 212a-212h and 214 from FIG. 2A, such that the specific pattern including the area of interest 316 may be recognized and associated with a pattern of the IC design layout using the specific pattern from the pattern bank. In the present embodiment, the specific pattern to be included in the pattern bank includes feature 214 and immediately adjacent features 212b, 212c, 212f, and 212g. In an alternative embodiment, the specific pattern to be included in the pattern bank includes feature 214 and only two immediately adjacent features 212b and 212c.

It is understood that any number of patterns including any number of features may be formed on the substrate 300 and may be used to identify specific patterns including areas of interest (or hot-spots) to be included within the pattern bank. For example, a pattern including only a single feature may be used to identify an area of interest within that pattern to be included in the pattern bank. In such embodiments the specific pattern to be included in the pattern bank includes only one feature with an identified area of interest (or hot-spot). It is also understood that the specific pattern to be included in the pattern bank may include more than one area of interest (or hot-spot) within one or more features of the specific pattern. It is further understood that the pattern bank may comprise any number (plurality) of specific patterns identified before, during, and after the manufacturing process and/or specific patterns with areas of interest identified by modeling of the IC design layout.

After building the pattern bank, the method continues to step 106 where pattern recognition dissection of the IC design layout is performed using the pattern bank to segment portions of patterns within the IC design layout. The pattern recognition dissection includes using a specific pattern from the pattern bank to recognize that pattern within an IC design layout. After recognizing that specific pattern within the IC design layout, the area of interest (or hot-spot) is located and tagged. After tagging the area of interest within the IC design layout, edges of the located area of interest within the IC design layout are dissected into a plurality of segments, according appropriate pattern recognition dissection functions that have been predefined for that area of interest.

Figure 3:
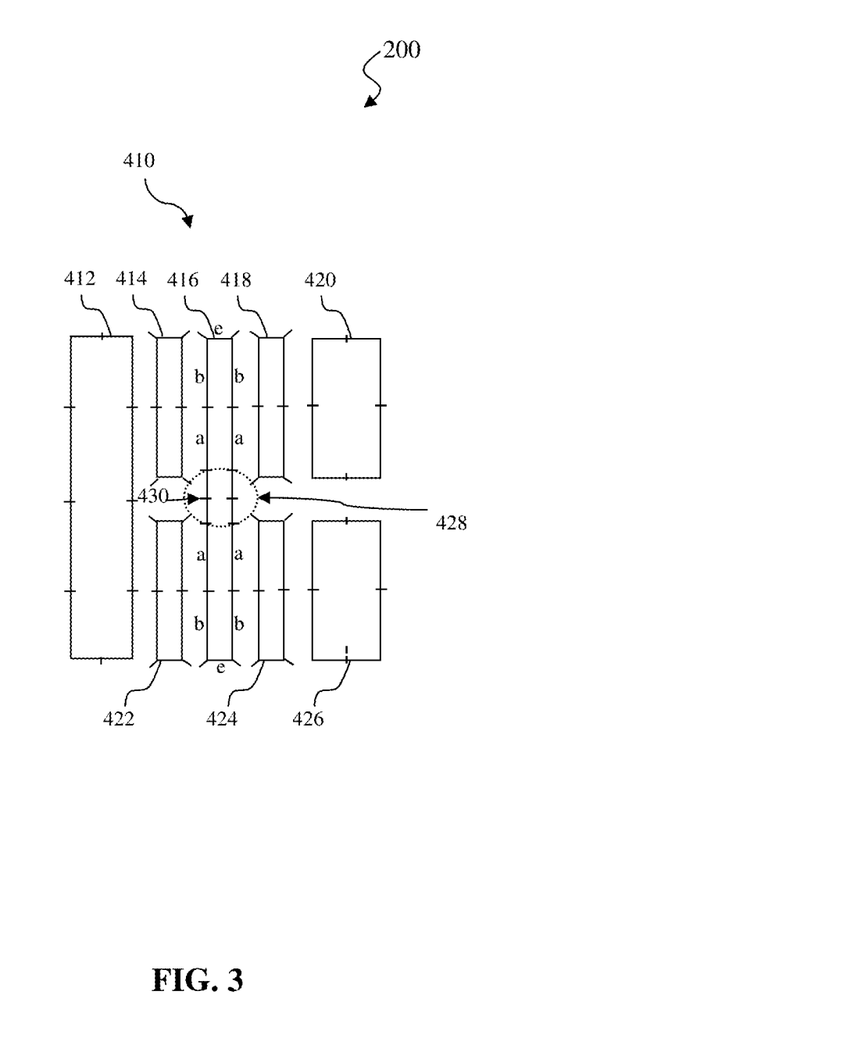

As an example, with reference to FIG. 3, in the present embodiment, the IC design layout includes a pattern 410 including a plurality of features (e.g., 412-426) including varying lengths and widths. In the present embodiment, the specific pattern that is included in the pattern bank includes feature 214 (with its identified area of interest 316 of FIG. 3) and immediately adjacent features 212b, 212c, 212f, and 212g of FIG. 2. This specific pattern from the pattern bank is used to recognize a similar pattern within the IC design layout 200. In this case, the specific pattern from the pattern bank is associated with features 414, 416, 418, 422, and 424 of pattern 410 of the IC design layout 200. After the specific pattern has been recognized, the area of interest (or hot-spot) 428 is located and tagged within the pattern 410. Thereafter, edges of the area of interest 428 within the IC design layout 200 are dissected into a plurality of segments, according to appropriate pattern recognition dissection functions. In the illustrated embodiment, the area of interest 428 is dissected into four segments defined by dissection points (or stitching points) 430. A portion of the edges of feature 416 between two adjacent dissection points 430 defines a segment. It is understood that the pattern recognition dissection functions may dissect an area of interest into any number of symmetric/asymmetric equal/unequal segments, according to appropriate pattern recognition dissection functions.

In some embodiments, before, during, or after the dissection of the IC design layout, a rule based dissection is also performed. Rule based dissection may include utilizing rules based on characteristics of the feature or pattern to be dissected to determine where to place dissection points. For example, rule based dissection may utilize characteristics such as user-specified dissection length, critical dimension (CD), space, segment orientation, segment length, among others, to define rules that determine where to place dissection points. The resultant dissection segments are classified as (a), overt type (b), invert type (c), single type (d), end type (e), jog type (f), etc.... The run type (a) is a segment along an edge run (long portion) of a feature; the overt type (b) is a segment along an edge toward an overt (outer) corner of a feature; the invert type (c) is a segment along an edge toward an invert (inner) corner of a feature; the single type (d) is a single edge segment; the end type (e) is a segment along an end edge of a feature; and the jog type is a segment along a jog edge of a feature. It is understood that the rule based dissection may be preformed in a particular order and may be repeated to refine the dissection points according to the defined rules.

With continued reference to FIG. 3, as an example, the rule based dissection is applied to the IC design layout 200 to segment other portions of the features of the pattern 210 within the design layout 200. In one embodiment, rule based pattern dissection is applied to feature 416 of pattern 210 to generate multiple segments defined by dissection points 430. In the present embodiment, the dissection points 430 are generated to the feature 416 by the rule based dissection, defining fourteen total segments of the edges of the pattern 210. As illustrated, in the present embodiment, the rules apply run type (a), overt type (b) and end type (e) to produced the segments of feature 416. In another embodiment, the pattern dissection is similarly applied to the features 412, 414, 418, 420, 422, 424, and 426 as illustrated in FIG. 3.

Further, the rule based dissection may be applied to patterns according to design rules and mask rules. For example, a pattern in the IC design layout 200 can be dissected differently, depending on the geometry and dimensions of the corresponding pattern. In another example, a pattern may be dissected into a plurality of segments with different dimensions in one direction. In an additional example, when a pattern is asymmetric, the number of segments and the dimensions of the segments generated from the pattern by the dissection can be different between a first direction and a second direction. The various design rules and mask rules can be extracted from the semiconductor manufacturer and/or mask manufacturer in consideration of the semiconductor and mask manufacturing capability. IC design follows the design and mask rules in order to generate producible circuit patterns. It is understood that the above examples, illustrated in FIG. 3 of pattern recognition dissection and rule based dissection are intended to be illustrative and are not limiting, unless expressly claimed.

The method continues to step 108 where pattern recognition retargeting of the IC design layout is performed using the pattern bank to apply suitable retargeting to the area of interest (or hot-spot) of the feature of the pattern of the IC design layout. The pattern recognition retargeting includes using a specific pattern from the pattern bank to recognize a substantially similar pattern within an IC design layout. After recognizing the substantially similar pattern within the IC design layout, the area of interest (or hot-spot) is located and tagged within the pattern within the IC design layout. After tagging the area of interest within the IC design layout, segments of the area of interest are assigned target points, according to appropriate pattern recognition retargeting functions that have been predefined for that area of interest. In further embodiments, pattern recognition retargeting of the IC design layout further includes modifying the pattern of the IC design layout, according to appropriate pattern recognition retargeting functions that have been predefined for that area of interest. Modifying the pattern of the IC design layout may include moving and/or resizing one or more segment of the feature of the pattern of the IC design layout, or other appropriate modifications.

In some embodiments, before, during, or after the pattern recognition retargeting of the IC design layout, a rule based retargeting is also performed. Rule based retargeting may utilize pattern or feature geometry characteristics such as critical dimensions (CD), segment orientation, segment length, space, angle orientation, and segment type combination to identify the specific group segments of the pattern for applying rule based retargeting treatment. Rule based retargeting may include assigning target points and modifying the pattern of the IC design layout, according to appropriate rules. Modifying the pattern of the IC design layout may include moving and/or resizing one or more segments of the feature of the pattern of the IC design layout, or other appropriate modifications.

Figure 4A:
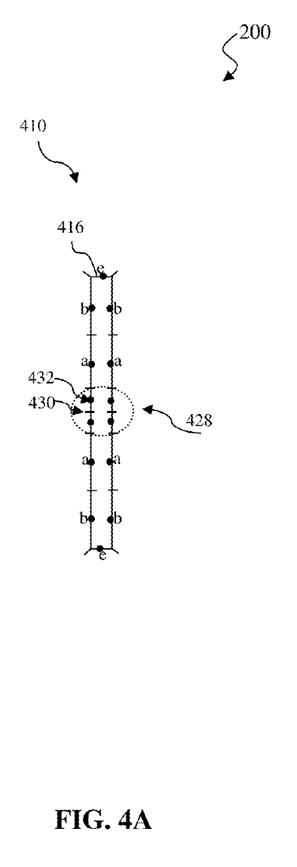
Figure 4B:
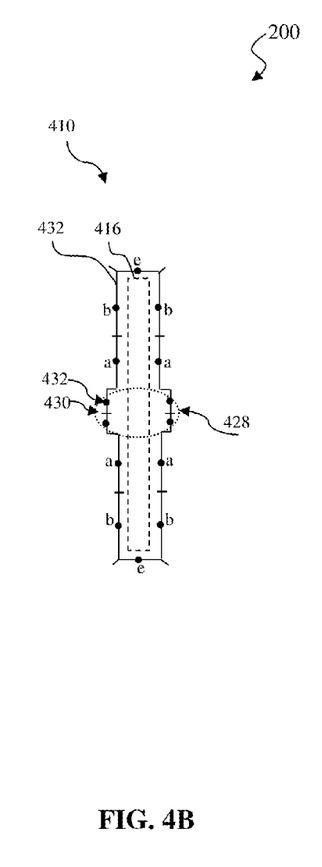

As an example, with reference to FIGS. 4A and 4B, illustrated is an embodiment of pattern recognition retargeting and rule based retargeting applied to feature 416 of FIG. 3, according to various aspects of the disclosure. With reference to FIG. 4A, pattern recognition retargeting and rule based retargeting includes assigning target 430 points to segments of the area of interest 428 and to other segments of other areas of feature 416 of pattern 410 of the IC design layout 200. With reference to FIG. 4B, after assigning target points 430 to the segments of the respective areas, the feature 416 of the pattern 410 IC of the design layout 200 is modified. In the illustrated example, the segments of the feature 416 are moved and resized according to appropriate pattern recognition functions and appropriate rules. As illustrated, the pattern recognition functions result in greater dimensional differences to the segments of the area of interest 428. The feature 432, which results from the retargeting, has modified dimensions from that of feature 416. In another embodiment, the rule based retargeting is similarly applied to the features 412, 414, 418, 420, 422, 424, and 426 of FIG. 3.

The method continues to step 108 where optical proximity correction (OPC) simulation takes place on the IC design layout to compensate for image errors due to diffraction or process effects. OPC generates simulated contours of what a formed pattern will look like on a substrate of a wafer. When a simulated contour of the pattern 210 is generated during OPC, the defined target points of the pattern 210 are checked to verify if the target is within or overlapped with the simulated contour of the pattern 210.

The OPC is performed to correct image errors (such as overlap of contour) by modifying the IC design layout 200. The OPC may include moving edges of a pattern and adding assist features to the pattern. In one embodiment, the pattern is resized, repositioned, and/or reshaped. In another embodiment, various assist features, such as scattering bars, serifs or hammerheads are added to the pattern. The assist features may be placed a distance away from the pattern (such as scattering bars) or be placed adjacent to the pattern (such as serifs and hammerheads). In one embodiment of the OPC implementation, segments of a pattern are moved outward from the pattern. Additionally, other features may be added or other action may be applied to the IC design layout 200. For example, dummy insertion features may be added to the IC design layout 200 for enhanced chemical mechanical polishing (CMP) or other processing advantages.

After performing OPC, a mask rule check (MRC) may be performed on the IC design layout 200. During MRC, the IC design layout 200 is checked by one or more mask rules and is modified accordingly. In one embodiment, various mask rules are extracted from the mask fabrication. Various mask making data are collected from the mask fabrication and extracted into a set of rules that the IC design layout, as the pattern to be imaged to a mask, should follow. In one embodiment, the MRC is implemented to the IC design layout 200 through the various segments of the patterns. The segments that fail one or more mask rules are modified according to the appropriate mask rules.

As an example, one of the mask rules, among others, is that the distance between adjacent features is equal to or greater than a minimum distance (Dmin). If the distance between adjacent features is less than Dmin, the contour of the feature is modified such that the violated mask rule is satisfied after the modification. The modification includes modifying and/or moving the relevant segment(s) contour to increase the corresponding distance.

After MRC, the method 100 continues to step 112 where a modified IC design layout is produced. A modified IC design layout 200 may be provided in a format accessible by a mask making tool, such as an e-beam mask writer. In one embodiment, the modified IC design layout 200 is expressed in a gds format. The modified IC design layout 200 includes various modifications from the OPC and the MRC. After producing the modified IC design layout a tape-out may be prepared representative of the modified IC design layout. The tape-out may be subsequently used for fabrication of a mask or a group of masks.

The method continues to step 114 where a mask is made in accordance with the modified IC design layout. In one embodiment, an e-beam or a mechanism of multiple e-beams is used to form a pattern on a mask (photomask or reticle) based on the modified IC design layout 200. The mask can be formed in various technologies. In one embodiment, the mask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art.

Other processing steps may follow after the formation of the mask. In this embodiment, a semiconductor wafer is fabricated using a mask or a set of masks formed by the above method. The semiconductor wafer includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor wafer may further include various doped regions, dielectric features, and multilevel interconnects (or are formed at subsequent manufacturing steps). In one example, the mask is used in an ion implantation process to form various doped regions in the semiconductor wafer. In another example, the mask is used in an etching process to form various etching regions in the semiconductor wafer. In another example, the mask is used in a deposition process, such as chemical vapor deposition (CVD) or physical vapor deposition (PVD), to form a thin film in various regions on the semiconductor wafer. Various manufacturing data may be collected from various manufacturing processes including CVD, PVD, etching, ion implantation and a lithography process from the previously processed semiconductor wafers, processing tools, and metrology tools.

Thus, the present disclosure provides an exemplary integrated circuit (IC) method. The method includes building a pattern bank including a pattern having an area of interest. The method further includes recognizing that the pattern of the pattern bank corresponds to a pattern of an IC design layout. The method further includes identifying an area of interest of the pattern of the IC design layout that corresponds to the area of interest of the pattern of the pattern bank. The method further includes performing pattern recognition dissection on the area of interest of the pattern of the IC design layout to dissect the area of interest of the pattern of the IC design layout into a plurality of segments. The method further includes after performing pattern recognition dissection, producing a modified IC design layout In some embodiments, the method further includes performing rule based dissection to the pattern of the IC design layout to dissect another area of the pattern of the IC design layout into another plurality of segments. In various embodiments, the method further includes performing pattern recognition retargeting of the pattern of the IC design layout to assign a plurality of target points to the plurality of segments of the area of interest of the pattern of the IC design layout. In certain embodiments, the method further includes performing rule based retargeting to the pattern of the IC design layout to assign another plurality of target points to the another plurality of segments of the another area of the pattern of the IC design layout. In further embodiments, the method further includes producing a tape-out based on the modified IC design layout. In an embodiment, the method further includes fabricating a mask according to the modified IC design layout. In some embodiments, the method further includes applying an optical proximity correction (OPC) to the IC design layout; and applying a mask rule check (MRC) to the IC design layout.

In some embodiments, building the pattern bank includes using empirical data collected from a wafer to identify the pattern of the pattern bank and the area of interest of the pattern of the pattern bank. In various embodiments, building the pattern bank includes using model data collected from a simulation to identify the pattern of the pattern bank and the area of interest of the pattern of the pattern bank.

The present disclosure also provides another embodiment of an integrated circuit (IC) method. The method includes providing a pattern bank including first and second patterns. The method further includes recognizing that the first pattern of the pattern bank corresponds to a first pattern of a IC design layout and that the second pattern of the pattern bank corresponds to a second pattern of the IC design layout. The method further includes performing pattern recognition retargeting of the first pattern of the IC design layout to assign a target point to a hot-spot of the first pattern of the IC design layout and to assign a target point to a hot-spot of the second pattern of the IC design layout. The method further includes after performing pattern recognition retargeting, producing a modified IC design layout.

In some embodiments, The method further includes performing pattern recognition dissection of the first pattern of the IC design layout to dissect the hot-spot of the first pattern of the IC design layout into a plurality of segments and to dissect the hot-spot of the second pattern of the IC design layout into a plurality of segments. In various embodiments, the method further includes performing rule based retargeting to the first and second patterns of the IC design layout; and performing rule based dissection to the first and second patterns of the IC design layout. In certain embodiments, the method further includes fabricating a mask according to the modified IC design layout. In some embodiments, the first pattern of the pattern bank includes a plurality of features, and the second pattern of the pattern bank includes only a single feature.

The present disclosure provides yet another embodiment of an integrated circuit (IC) method. The method includes receiving an IC design layout receiving an IC design layout having a pattern. The method further includes associating the pattern of the IC design layout to a pattern of a pattern bank. The method further includes locating an area of interest of the pattern of the IC design layout using the associated pattern of the pattern bank. The method further includes performing pattern recognition dissection on the area of interest of the pattern of the IC design layout. The method further includes performing pattern recognition retargeting on the area of interest of the patter of the IC design layout. The method further includes after performing pattern recognition retargeting, producing a modified IC design layout.

In some embodiments, the method further includes performing rule based dissection of the pattern of the IC design layout; and performing rule based retargeting of the pattern of the IC design layout. In some embodiments, the method further includes making a mask according to the modified IC design layout.

In some embodiments, performing pattern recognition dissection includes dissecting the area of interest of the pattern of the IC design layout into a plurality of segments, and performing pattern recognition retargeting includes assigning a target point to at least one segment of the plurality of segments and modifying at least one segment of the plurality of segments. In various embodiments, the pattern of the pattern bank includes a plurality of features. In certain embodiments, the pattern of the pattern bank includes only a single feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) method comprising:
building a pattern bank including a pattern having an area of interest;
receiving a data file including an IC design layout;
recognizing that the pattern of the pattern bank corresponds to a pattern of the IC design layout;
identifying an area of interest of the pattern of the IC design layout that corresponds to the area of interest of the pattern of the pattern bank;
performing pattern recognition dissection on the area of interest of the pattern of the IC design layout to dissect edges of the area of interest of the pattern of the IC design layout into a plurality of segments;
after performing pattern recognition dissection, performing pattern recognition retargeting of the pattern of the IC design layout to assign a plurality of target points to the plurality of segments of the area of interest of the pattern of the IC design layout;
after performing pattern recognition retargeting, performing, using a computer, an optical proximity correction (OPC) to the IC design layout; and
producing a modified IC design layout based on the IC design layout that has been performed by the OPC and the pattern recognition retargeting.

2. The IC method of claim 1, further comprising:
performing rule based dissection to the pattern of the IC design layout to dissect another area of the pattern of the IC design layout into another plurality of segments.

3. The IC method of claim 2, further comprising:
performing rule based retargeting to the pattern of the IC design layout to assign another plurality of target points to the another plurality of segments of the another area of the pattern of the IC design layout.

4. The IC method of claim 1, further comprising:
producing a tape-out based on the modified IC design layout.

5. The IC method of claim 1, further comprising
fabricating a mask according to the modified IC design layout.

6. The IC method of claim 1, further comprising:
applying an optical proximity correction (OPC) to the IC design layout; and
applying a mask rule check (MRC) to the IC design layout.

7. The IC method of claim 1, wherein building the pattern bank includes using empirical data collected from a wafer to identify the pattern of the pattern bank and the area of interest of the pattern of the pattern bank.

8. The IC method of claim 1, wherein building the pattern bank includes using model data collected from a simulation to identify the pattern of the pattern bank and the area of interest of the pattern of the pattern bank.

9. An integrated circuit (IC) method comprising:
providing a pattern bank including first and second patterns;
determining that the first pattern of the pattern bank corresponds to a first pattern of an IC design layout and that the second pattern of the pattern bank corresponds to a second pattern of the IC design layout;
based on the determining, performing pattern recognition retargeting of the first pattern of the IC design layout to assign a first target point to a hot-spot of the first pattern of the IC design layout and to assign a second target point to a hot-spot of the second pattern of the IC design layout;
after performing pattern recognition retargeting, performing pattern recognition dissection of the first pattern of the IC design layout to dissect edges of the hot-spot of the first pattern of the IC design layout into a plurality of segments and to dissect edges of the hot-spot of the second pattern of the IC design layout into a plurality of segments;
after performing pattern recognition retargeting, performing, using a computer, an optical proximity correction (OPC) to the IC design layout; and
producing a modified IC design layout based on the IC design layout that has been performed by the OPC.

10. The IC method of claim 9, further comprising:
performing rule based retargeting to the first and second patterns of the IC design layout; and
performing rule based dissection to the first and second patterns of the IC design layout.

11. The IC method of claim 9, further comprising fabricating a mask according to the modified IC design layout.

12. The IC method of claim 9, wherein the first pattern of the pattern bank includes a plurality of features, and
wherein the second pattern of the pattern bank includes only a single feature.

13. An integrated circuit (IC) method comprising:
receiving an IC design layout having a pattern;
associating the pattern of the IC design layout to a pattern of a pattern bank;
locating an area of interest of the pattern of the IC design layout using the associated pattern of the pattern bank;
performing pattern recognition dissection on the area of interest of the pattern of the IC design layout;
performing pattern recognition retargeting on the area of interest of the patter pattern of the IC design layout;
after performing pattern recognition retargeting, performing, using a computer, an optical proximity correction (OPC) to the IC design layout; and
producing a modified IC design layout based on the IC design layout that has been performed by the OPC and the pattern recognition retargeting.

14. The IC method of claim 13, further comprising:
performing rule based dissection of the pattern of the IC design layout; and
performing rule based retargeting of the pattern of the IC design layout.

15. The IC method of claim 13, further comprising making a mask according to the modified IC design layout.

16. The IC method of claim 13, wherein performing pattern recognition dissection includes dissecting the area of interest of the pattern of the IC design layout into a plurality of segments, and
wherein performing pattern recognition retargeting includes assigning a target point to at least one segment of the plurality of segments and modifying at least one segment of the plurality of segments.

17. The IC method of claim 13, wherein the pattern of the pattern bank includes a plurality of features.

18. The IC method of claim 17, wherein the pattern of the pattern bank includes only a single feature.

* * * * *